(12) United States Patent
Song et al.

(10) Patent No.: US 11,585,843 B2
(45) Date of Patent: Feb. 21, 2023

(54) DETECTION CIRCUIT FOR OPEN, CLOSE AND SUSPENSION STATES OF HIGH AND LOW LEVEL EFFECTIVE SWITCH IN VEHICLE

(71) Applicants: CHONGQING UNIVERSITY, Chongqing (CN); STAR INSTITUTE OF INTELLIGENT SYSTEMS, Chongqing (CN); DB (CHONGQING) INTELLIGENT TECHNOLOGY RESEARCH INSTITUTE CO., LTD., Chongqing (CN); Chongqing Yingdi Industry (Group) Co., Ltd., Chongqing (CN)

(72) Inventors: Yongduan Song, Chongqing (CN); Shuaicheng Hou, Chongqing (CN); Jiawei Chen, Chongqing (CN); Mi Fang, Chongqing (CN)

(73) Assignees: CHONGQING UNIVERSITY, Chongqing (CN); STAR INSTITUTE OF INTELLIGENT SYSTEMS, Chongqing (CN); DB (CHONGQING) INTELLIGENT TECHNOLOGY RESEARCH INSTITUTE CO., LTD., Chongqing (CN); Chongqing Yingdi Industry (Group) Co., Ltd., Chongqing (CN)

( * ) Notice: Subject to any disclaimer, the term of this patent is extended or adjusted under 35 U.S.C. 154(b) by 0 days.

(21) Appl. No.: 17/589,237

(22) Filed: Jan. 31, 2022

(65) Prior Publication Data

US 2022/0291276 A1 Sep. 15, 2022

(51) Int. Cl.
*G01R 31/26* (2020.01)
*B60R 16/02* (2006.01)
*H03K 17/60* (2006.01)

(52) U.S. Cl.
CPC .......... *G01R 31/2617* (2013.01); *B60R 16/02* (2013.01); *H03K 17/60* (2013.01)

(58) Field of Classification Search
CPC ........... G01R 31/2617; G01R 31/2621; G01R 31/3277; G01R 31/52; G01R 31/54;
(Continued)

(56) References Cited

U.S. PATENT DOCUMENTS

2013/0162261 A1* 6/2013 Szoke .................... G01R 31/52
324/503
2018/0143250 A1* 5/2018 Nowicki ............ G01R 31/3277
(Continued)

*Primary Examiner* — Thang X Le
(74) *Attorney, Agent, or Firm* — Hunton Andrews Kurth LLP

(57) ABSTRACT

A detection circuit for open, close and suspension states of a high and low level effective switch in a vehicle. The circuit includes an optocoupler circuit module, a low-level active path module, a high-level active path module, a filtering and debouncing module, a transient suppression module, and a wiring terminal. The optocoupler circuit module is connected to the low-level active path module, the high-level active path module and the low-level active path module are connected in parallel to the filtering and debouncing module, and the filtering and debouncing module is connected to the transient suppression module, and then connected to the external high-level active switch or low-level active switch through the wiring terminal. Whether it is a high-level active switch or a low-level active switch, the detection circuit can distinguish whether the switch is in the closed or suspended state, and the strong and weak voltages are isolated.

2 Claims, 2 Drawing Sheets

(58) Field of Classification Search
CPC ........... H03K 17/0828; H03K 17/0826; H03K 17/082; H03K 17/60; H03K 17/687; H03K 17/7955; B60R 16/02
See application file for complete search history.

(56) References Cited

U.S. PATENT DOCUMENTS

2018/0328973 A1* 11/2018 Kamath ............. G01R 31/2829
2022/0018885 A1* 1/2022 Fu ......................... B60L 3/0046

* cited by examiner

DETECTION CIRCUIT FOR OPEN, CLOSE AND SUSPENSION STATES OF HIGH AND LOW LEVEL EFFECTIVE SWITCH IN VEHICLE

CROSS REFERENCE TO RELATED APPLICATION

This patent application claims the benefit and priority of Chinese Patent Application No. 202110265411.3, filed on Mar. 11, 2021, the disclosure of which is incorporated by reference herein in its entirety as part of the present application.

TECHNICAL FIELD

The present disclosure relates to the field of analog circuit technology and level signal detection technology, and in particular to a detection circuit for open, close and suspension states of a high and low level effective switch in a vehicle.

BACKGROUND ART

Heavy-duty vehicles have the characteristics of customization, low output, and quick modification. There is no uniform standard among component manufacturers, which makes some switching signals active at a high level, and some active at a low level. Next, when the original equipment manufacturer (OEM) installs buttons or external switches, some are connected to the power supply, and some are connected to the common ground, which also makes some switch signals active at the high level, and some active at the low level. The difference of these switching levels brings difficulties to hardware circuit design and programming. Therefore, a general detection circuit that can distinguish between closed and suspended states of a high-level or low-level active switch is needed to meet the requirements of current general vehicle controllers for switching status detection.

At present, in order to solve the problem that the same circuit is not compatible to detection of the high active level, low active level and suspended state of the external switch, related patents have provided solutions, including patents as follows.

1. In the patent with the application number 2012103387591 and entitled "a switch state detection circuit", in order to distinguish between high and low levels and suspended states, a high-level and low-level periodic inversion circuit is added, so as to present three types of signals of a power supply voltage, a power ground, and high-level and low-level inversion signals at an input terminal of an input/output (I/O) port of a single-chip microcomputer for switch state detection. However, the high-level and low-level periodic inversion circuit needs to be connected to each I/O port of the single-chip microcomputer for switch state detection through a resistor, which not only increases the wiring difficulty, but also occupies an I/O port resource of the single-chip microcomputer. A scanning period of the I/O port of the single-chip microcomputer for switch state detection needs to be shorter than an inversion period of the high-level and low-level periodic inversion circuit, so as to distinguish whether an input terminal signal is a high-low inversion level, a high level, or a low level, which leads to complicated programming.

2. In the Chinese patent with the application number 2018105454615 and entitled "a circuit capable of detecting suspension and high and low levels of an input port", a switch is pulled up from a suspended state to an analog voltage value between a power supply voltage and a power ground. A port voltage is sampled periodically by an analog-to-digital converter (ADC) port of a single-chip microcomputer, thereby distinguishing the three states of the switch connected to the power supply, switch grounding, and switch suspension. However, this method occupies very important ADC resources of the single-chip microcomputer, and cannot be applied to the single-chip microcomputer without ADC, and increases the programming difficulty at the same time.

3. In the Chinese patent with the application number 2012104409297 and entitled "a 3-state control signal input-output (IO) circuit", on the basis of pulling up a switch from a suspended state to an analog voltage value between a power supply voltage and a power ground, the analog quantity is converted into a digital TO level signal using two comparators. The output of the two comparators corresponding to the high-level input is 11, the output of the two comparators corresponding to the low-level input is 00, and the output of the two comparators corresponding to the suspended input is 01, which requires two TO ports of a single-chip microcomputer to distinguish the three switch input states. Therefore, this method is not suitable for situations with many switching inputs, and the comparator is generally larger, which increases the printed circuit board (PCB) area.

In summary, the current existing methods still have disadvantages of complicated circuits, consumption of single-chip microcomputer resources, and non isolation of external inputs. Therefore, there is an urgent need for a general circuit with an isolated TO port to distinguish between the closed state and the suspended state of the high-active switch or the low-active switch.

SUMMARY

In view of this, an objective of the present disclosure is to provide a detection circuit for open, close and suspension states of a high and low level effective switch in a vehicle in view of the problem that a detection circuit for a suspended state of a switch in the prior art is too complicated and there is no detection circuit for closed and suspended states applicable to both high-level and low-level active switches, so as to solve the problem of state detection of different level switches in the design of general controllers in the heavy-duty vehicle industry.

The present disclosure provides a detection circuit for open, close and suspension states of a high and low level effective switch in a vehicle, including: an optocoupler circuit module, a low-level active path module, a high-level active path module, a filtering and debouncing module, a transient suppression module, and a wiring terminal.

The optocoupler circuit module includes an optocoupler, a second resistor, a bias resistor, and a first resistor, the optocoupler is composed of a light-emitting diode (LED) and a phototransistor, the LED is connected in parallel to the bias resistor, an anode of the LED is connected to a first terminal of the second resistor, a second terminal of the second resistor is connected to a power supply, and a cathode of the LED is connected to the bias resistor to form an output terminal of the optocoupler circuit module. A collector of the phototransistor is connected to a first terminal of the first resistor, a second terminal of the first resistor is connected to a power supply of a control unit, the collector of the phototransistor is further used to connect an IO port of the control unit, and an emitter of the phototransistor is connected to an isolated ground.

The low-level active path module includes a diode, an anode of the diode is an input terminal of the low-level active path module, and a cathode of the diode is an output terminal of the low-level active path module.

The high-level active path module includes a negative-positive-negative (NPN) transistor, a base voltage divider of the NPN transistor, an emitter voltage divider of the NPN transistor, and a positive-negative-positive (PNP) transistor. The base voltage divider of the NPN transistor is composed of a fifth resistor and a sixth resistor, a first terminal of the fifth resistor is connected to the output terminal of the low-level active path module, a second terminal of the fifth resistor is connected to a first terminal of the sixth resistor and a base of the NPN transistor, and a second terminal of the sixth resistor is connected to a common ground. The emitter voltage divider of the NPN transistor includes a seventh resistor, an eighth resistor, and a second capacitor, an emitter of the NPN transistor is connected to a first terminal of the seventh resistor, a second terminal of the seventh resistor is connected to the power supply, the emitter of the NPN transistor is further connected to a first terminal of the eighth resistor, the other terminal of the eighth resistor is connected to the common ground, and the second capacitor is connected in parallel to the eighth resistor. A collector of the NPN transistor is connected to a base of the PNP transistor, an emitter of the PNP transistor is connected to the output terminal of the optocoupler circuit module, and a collector of the PNP transistor is connected to the common ground.

The filtering and debouncing module includes a third resistor, a fourth resistor, and a first capacitor, a first terminal of the third resistor is connected to the output terminal of the low-level active path module, a second terminal of the third resistor is connected to a first terminal of the fourth resistor, the second terminal of the third resistor is further connected to a first terminal of the first capacitor, a second terminal of the first capacitor is connected to the common ground, a second terminal of the fourth resistor is connected to the wiring terminal, and the wiring terminal is used to connect an external switch.

The transient suppression module is a transient suppression diode, an input terminal of the transient suppression diode is connected to the second terminal of the fourth resistor, and an output terminal of the transient suppression diode is connected to the common ground.

When the external switch connected to the wiring terminal is in the suspended state or the wiring terminal is not connected to the external switch, a current from the power supply passes through the second resistor, then mainly through the bias resistor, then through the low-level active path module, and then through the base voltage divider of the NPN transistor of the high-level active path module, and then returns to the common ground, and the current passing through the LED is incapable of making the optocoupler conducted. Under pull-up action of the first resistor, a level to the TO port of the control unit is high.

When the wiring terminal is connected to the low-level active switch, and the low-level active switch is in the closed state, a voltage difference between the base and the emitter of the NPN transistor is incapable of making the base and the emitter conducted, and a current from the power supply passes through the second resistor, then mainly through the LED, through the low-level active path module, through the filtering and debouncing module, through the wiring terminal, and through the external low-level active switch, and returns to the common ground, and the high-level active path module is invalid. The current passing through the LED makes the optocoupler conducted, and under pull-down action of the phototransistor, a level to the IO port of the control unit is low.

When the wiring terminal is connected to the high-level active switch, and the high-level active switch is in the closed state, a cathode voltage of the diode in the low-level active path module is greater than an anode voltage, and the low-level active path module is invalid. A first current starts from the power supply, passes through the emitter voltage divider of the NPN transistor in the high-level active path module, and then flows back to the common ground to obtain an emitter voltage of the NPN transistor. A second current starts from the power supply, passes through the high-level active switch, through the wiring terminal, through the filtering and debouncing module, and through the base voltage divider of the NPN transistor in the high-level active path module, and flows back to the common ground, and a voltage difference between the base and the emitter of the NPN transistor makes the base and the emitter conducted. A third current starts from the base voltage divider of the NPN transistor, passes through the base of the NPN transistor, through the emitter of the NPN transistor, and through the eighth resistor, and flows back to the common ground, and at this time, the NPN transistor is in an amplification region. A fourth current starts from the power supply, passes through the second resistor, then mainly through the LED, then through the emitter of the PNP transistor, then through the base of the PNP transistor, then through the collector of the NPN transistor, then through the emitter of the NPN transistor, and then through the eighth resistor, and flows back to the common ground, and at this time, the PNP transistor is in the amplification region. A fifth current starts from the power supply, mainly passes through the LED, then through the emitter of the PNP transistor, and then through the collector of the PNP transistor, and returns to the common ground. The current passing through the LED makes the optocoupler conducted, and under pull-down action of the phototransistor of the optocoupler, a level to the IO port of the control unit is low.

Further, a power supply voltage may be +26±4 V, and the first resistor may be 4,700 ohms or 10,000 ohms. The second resistor may be 4,000 ohms, the bias resistor may be 1,000 ohms, a clamping voltage of the LED may be 1 V, a cutoff frequency of the filtering and debouncing module may be less than 1 kHz, and resistance values of the third resistor and the fourth resistor may be less than 100 ohms.

A difference between a voltage division value of the base voltage divider of the NPN transistor and a voltage division value of the emitter voltage divider of the NPN transistor in the high-level active path module may be in a range of 0-0.5 V when the external switch is in the suspended state, and greater than 0.7 V when the switch is in the closed state. When the external high-level active switch is in the closed state, the NPN transistor in the high-level active path module may be in the amplification region. Leakage currents of the base voltage divider of the NPN transistor and the emitter voltage divider of the NPN transistor may be 1 mA respectively when the external switch is in the suspended state or when the external switch is not connected.

The present disclosure has the following beneficial effects:

According to the detection circuit for open, close and suspension states of a high and low level effective switch in a vehicle provided by the present disclosure, when the wiring terminal is not connected to the external switch or the external switch is in the suspended state, the level to the IO port of the control unit is high. Whether the external switch connected to the wiring terminal is a high-level active switch or a low-level active switch, when the external switch is in the closed state, the level to the IO port of the control unit is low. Whether it is a high-level active switch or a low-level active switch, the detection circuit can distinguish whether the switch is in the closed or suspended state, and the strong and weak voltages are isolated to meet the requirements of vehicle generalization and modular design.

DETAILED DESCRIPTION OF THE EMBODIMENTS

Figure 1:
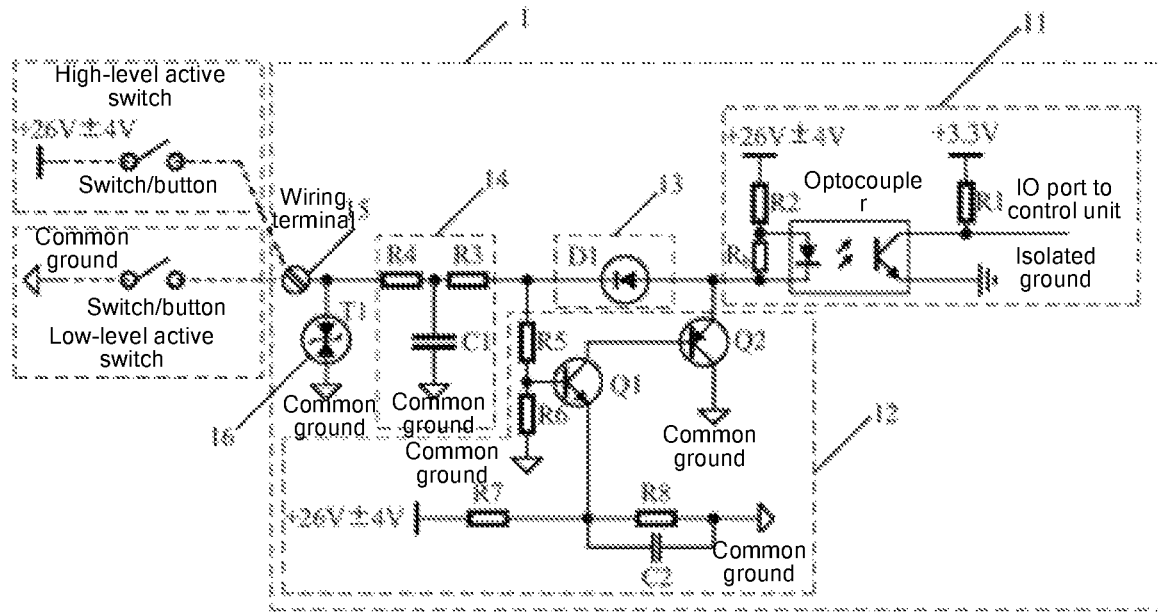
FIG. 1 is a diagram of a detection circuit for open, close and suspension states of a high and low level effective switch in a vehicle according to the present disclosure.
Figure 2:
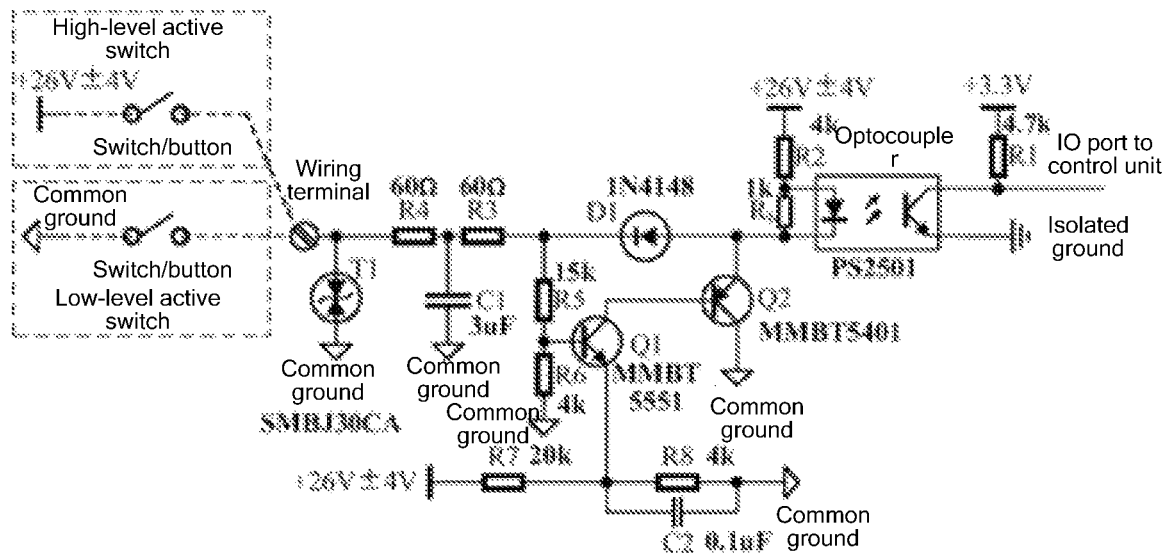
FIG. 2 is a circuit parameter configuration diagram of the detection circuit according to the present disclosure.

The present disclosure is described in further detail below with reference to the accompanying drawings and embodiments.

In the present embodiment, a detection circuit 1 for open, close and suspension states of a high and low level effective switch in a vehicle includes an optocoupler circuit module 11, a low-level active path module 13, a high-level active path module 12, a filtering and debouncing module 14, a transient suppression module 16, and a wiring terminal 15.

The optocoupler circuit module includes an optocoupler, a second resistor R2, a bias resistor $R_b$, and a first resistor R1, the optocoupler is composed of a LED and a phototransistor, the LED is connected in parallel to the bias resistor, an anode of the LED is connected to a first terminal of the second resistor, a second terminal of the second resistor is connected to a power supply, and a cathode of the LED is connected to the bias resistor to form an output terminal of the optocoupler circuit module. A collector of the phototransistor is connected to a first terminal of the first resistor, a second terminal of the first resistor is connected to a power supply of a control unit, the collector of the phototransistor is further used to connect an IO port of the control unit, and an emitter of the phototransistor is connected to an isolated ground.

The low-level active path module includes a diode D1, an anode of the diode is an input terminal of the low-level active path module, and a cathode of the diode is an output terminal of the low-level active path module.

The high-level active path module includes a NPN transistor Q1, a base voltage divider of the NPN transistor, an emitter voltage divider of the NPN transistor, and a PNP transistor Q2. The base voltage divider of the NPN transistor is composed of a fifth resistor R5 and a sixth resistor R6, a first terminal of the fifth resistor is connected to the output terminal of the low-level active path module, a second terminal of the fifth resistor is connected to a first terminal of the sixth resistor and a base of the NPN transistor, and a second terminal of the sixth resistor is connected to a common ground. The emitter voltage divider of the NPN transistor includes a seventh resistor R7, an eighth resistor R8, and a second capacitor C2, an emitter of the NPN transistor is connected to a first terminal of the seventh resistor, a second terminal of the seventh resistor is connected to the power supply, the emitter of the NPN transistor is further connected to a first terminal of the eighth resistor, the other terminal of the eighth resistor is connected to the common ground, and the second capacitor is connected in parallel to the eighth resistor. A collector of the NPN transistor is connected to a base of the PNP transistor, an emitter of the PNP transistor is connected to the output terminal of the optocoupler circuit module, and a collector of the PNP transistor is connected to the common ground.

The filtering and debouncing module includes a third resistor R3, a fourth resistor R4, and a first capacitor C1, a first terminal of the third resistor is connected to the output terminal of the low-level active path module, a second terminal of the third resistor is connected to a first terminal of the fourth resistor, the second terminal of the third resistor is further connected to a first terminal of the first capacitor, a second terminal of the first capacitor is connected to the common ground, a second terminal of the fourth resistor is connected to the wiring terminal, and the wiring terminal is used to connect an external switch.

The transient suppression module is a transient suppression diode T1, and has a function of absorbing the transient voltage impact of the external switch. An input terminal of the transient suppression diode is connected to the second terminal of the fourth resistor, and an output terminal of the transient suppression diode is connected to the common ground.

In the present embodiment, the external switch connected to the wiring terminal 15 may be a high-level active switch or a low-level active switch.

In the present embodiment, a power supply voltage is +26±4 V, and a power supply voltage of the control unit is +3.3 V. The optocoupler is configured to be PS2501, and the first resistor R1 is configured to be 4,700 ohms or 10,000 ohms. The second resistor R2 is configured to be 4,000 ohms, and the second resistor R2 has a function of limiting a current flowing through the LED of the optocoupler to be less than 10 mA. The bias resistor $R_b$ of the LED is configured to be 1,000 ohms, and this bias resistor $R_b$ has a function of making very little current flow through the LED when the external switch is in the suspended state to ensure that the optocoupler is not conducted. When the optocoupler is conducted, a clamping voltage of the LED is 1 V, so the current flowing through the bias resistor of the LED is constant at 1 mA, that is, when the external switch is in the closed state, the bias resistor will not shunt the conduction current of the LED too much, thereby improving the stability and reliability of the circuit.

Since the general switch jitter time is about 5-10 ms, a cutoff frequency of the filtering and debouncing module 14 is configured to be less than 1 kHz, resistance values of the third resistor R3 and the fourth resistor R4 are configured to be 60 ohms, and a value of the first capacitor C1 is 3 uF.

In the present embodiment, the model of the NPN transistor Q1 is MMBT5551, and the model of the PNP transistor Q2 is MMBT5401. The model of the diode in the low-level active path module 13 is 1N4148, and the model of the transient suppression diode in the transient suppression module 16 is SMBJ30CA.

In order to distinguish whether the external switch is in the suspended state or the closed state, a difference between a voltage division value of the base voltage divider of the NPN transistor Q1 and a voltage division value of the emitter voltage divider of the NPN transistor Q1 in the high-level active path module 12 is configured to be in a range of 0-0.5 V in the suspended state, and greater than 0.7 V when the switch is in the closed state, which ensures that when the external switch is in the suspended state, the NPN transistor Q1 in the high-level active path module 12 is in a cut-off region, and when the high-level active switch is in the closed state, the NPN transistor Q1 in the high-level active path module 12 is in an amplification region. In order to reduce the leakage current of the circuit, the leakage currents of the base voltage divider of the NPN transistor Q1 and the emitter voltage divider of the NPN transistor Q1 are configured to be 1 mA respectively when the external switch is in the suspended state or not connected. Therefore, a resistance value of the fifth resistor R5 is configured to be 15,000 ohms and a resistance value of the sixth resistor R6 is configured to be 4,000 ohms. A resistance value of the seventh resistor R7 is configured to be 20,000 ohms, a resistance value of the eighth resistor R8 is configured to be 4,000 ohms, and a resistance value of the second capacitor C2 is configured to be 0.1 uF.

Current flow directions of the high-level or low-level active switch in the suspended state and the closed state are described below in combination with FIGS. 3, 4, and 5 of the description.

Figure 3:
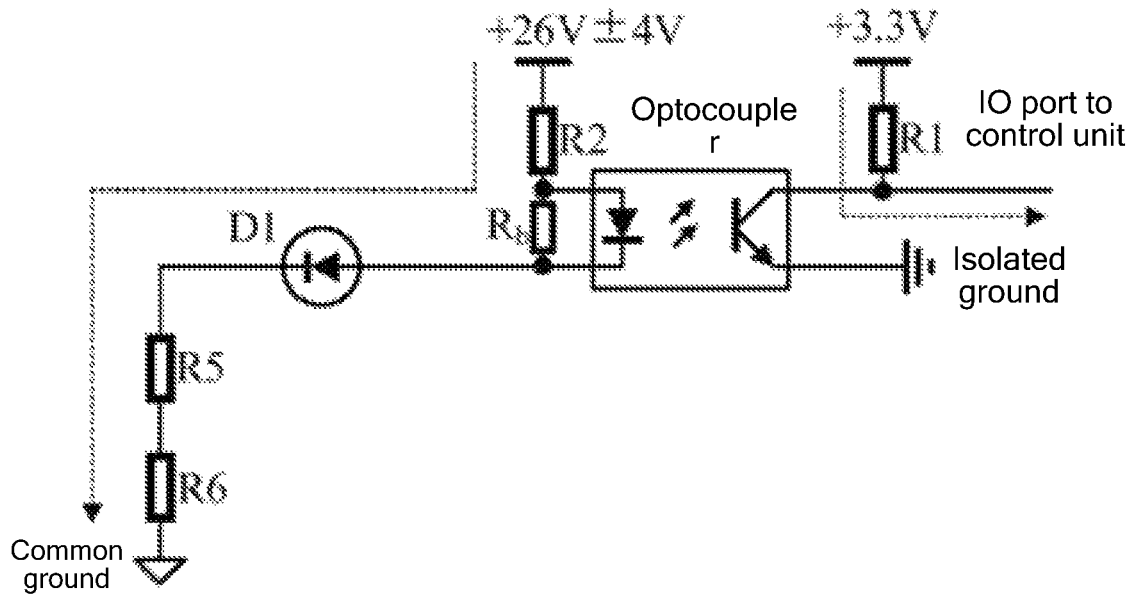
FIG. 3 is a current flow diagram of the detection circuit according to the present disclosure when the external switch is in the suspended state.

Situation 1: when the external switch connected to the wiring terminal is in the suspended state or the wiring terminal is not connected to the external switch, a main current flow direction is shown by the fine dotted line in FIG. 3 of the description, a current from the power supply +26±4 V passes through the second resistor R2, then mainly through the bias resistor $R_b$, then through the low-level active path module, and then through the base voltage divider of the NPN transistor of the high-level active path module, and then returns to the common ground. In this case, the leakage current of the current is about 1 mA, and only very little current flows through the LED, so the current passing through the LED is incapable of making the optocoupler conducted. Therefore, under pull-up action of the first resistor R1, a level to the IO port of the control unit is high.

Figure 4:
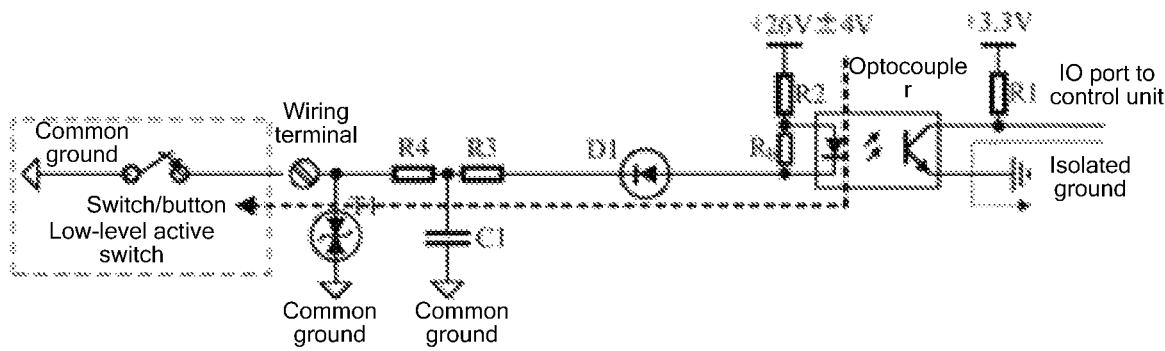
FIG. 4 is a current flow diagram of the detection circuit according to the present disclosure when the connected low-level active switch is in the closed state.
Figure 5:
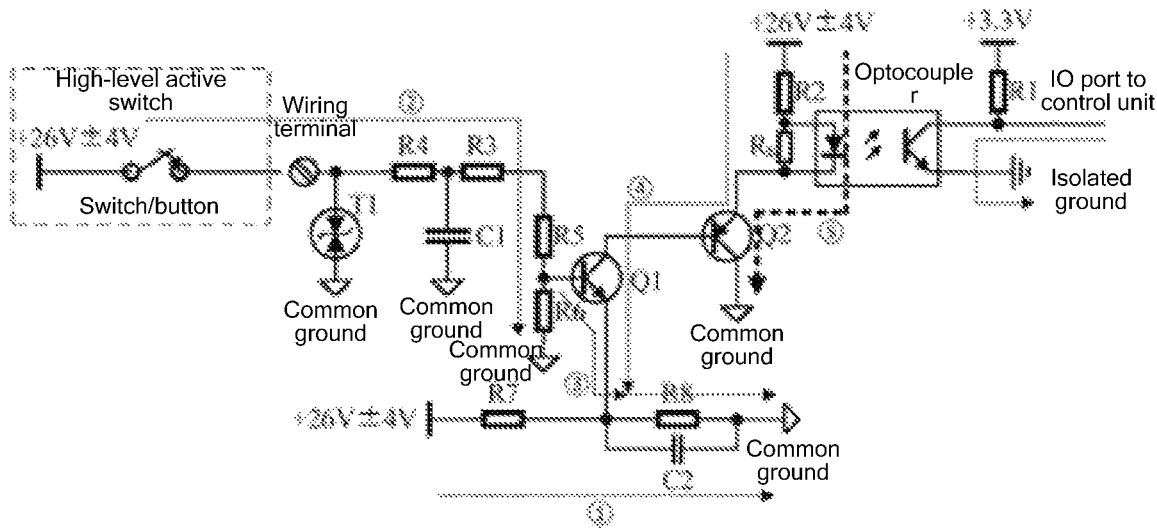
FIG. 5 is a current flow diagram of the detection circuit according to the present disclosure when the connected high-level active switch is in the closed state.

Situation 2: when the wiring terminal is connected to the low-level active switch, and the low-level active switch is in the closed state, a voltage difference between the base and the emitter of the NPN transistor is incapable of making the base and the emitter conducted, a main current flow direction is shown by the thick dotted line in FIG. 4 of the description, and a current from the power supply passes through the second resistor, then mainly through the LED, then through the low-level active path module, then through the filtering and debouncing module, then through the wiring terminal, and then through the external low-level active switch, and returns to the common ground. Since most of the current flows back to the ground through the filtering and debouncing module and the low-level active switch, the high-level active path module is invalid. The current passing through the LED makes the optocoupler conducted, and under pull-down action of the phototransistor, a level to the 10 port of the control unit is low.

Situation 3: when the wiring terminal is connected to the high-level active switch, and the high-level active switch is in the closed state, a cathode voltage of the diode in the low-level active path module is greater than an anode voltage, and the low-level active path module is invalid. As shown by the dotted line ① in FIG. 5 of the description, a first current starts from the power supply, passes through the emitter voltage divider of the NPN transistor in the high-level active path module, and then flows back to the common ground to obtain an emitter voltage of the NPN transistor. As shown by the dotted line ② in FIG. 5 of the description, a second current starts from the power supply, passes through the high-level active switch, through the wiring terminal, through the filtering and debouncing module, and through the base voltage divider of the NPN transistor in the high-level active path module, and flows back to the common ground. At this time, the voltage division value of the base voltage divider of the NPN transistor will increase under the direct action of the power supply voltage +26±4 V, resulting in a base voltage of the NPN transistor being 0.7 V higher than the emitter voltage, and the NPN transistor is conducted. When the NPN transistor is conducted, as shown by the dotted line ③ in FIG. 5 of the description, a third current starts from the base voltage divider of the NPN transistor, passes through the base of the NPN transistor, through the emitter of the NPN transistor, and through the eighth resistor, and flows back to the common ground, and at this time, the NPN transistor is in an amplification region. When the NPN transistor Q1 is in the amplification region state, as shown by the dotted line ④ in FIG. 5 of the description, a fourth current starts from the power supply, passes through the second resistor, then mainly through the LED, then through the emitter of the PNP transistor, then through the base of the PNP transistor, then through the collector of the NPN transistor, then through the emitter of the NPN transistor, and then through the eighth resistor, and flows back to the common ground, and at this time, the PNP transistor is in the amplification region. When the PNP transistor is in the amplification region state, after two stages of amplification, the current flowing through the PNP transistor Q2 is greatly amplified. Therefore, as shown by the thick dotted line ⑤ in FIG. 5 of the description, a fifth current starts from the power supply, mainly passes through the LED, then through the emitter of the PNP transistor, and then through the collector of the PNP transistor, and returns to the common ground. The current passing through the LED makes the optocoupler conducted, and under pull-down action of the phototransistor of the optocoupler, a level to the IO port of the control unit is low.

Therefore, when the wiring terminal is not connected to the external switch or the external switch is in the suspended state, the level to the IO port of the control unit is high. Whether the external switch connected to the wiring terminal is a high-level active switch or a low-level active switch, when the external switch is in the closed state, the level to the IO port of the control unit is low.

Finally, it should be noted that the above embodiment is only intended to explain, rather than to limit, the technical solutions of the present disclosure. Although the present disclosure is described in detail with reference to the preferred embodiment, those ordinarily skilled in the art should understand that modifications or equivalent substitutions made to the technical solutions of the present disclosure without departing from the spirit and scope of the technical solutions of the present disclosure should be included within the scope of the claims of the present disclosure.

What is claimed is:

1. A detection circuit for open, close and suspension states of a high and low level effective switch in a vehicle, comprising:

an optocoupler circuit module, a low-level active path module, a high-level active path module, a filtering and debouncing module, a transient suppression module, and a wiring terminal;

the optocoupler circuit module comprises an optocoupler, a second resistor, a bias resistor, and a first resistor, the optocoupler is composed of a light-emitting diode (LED) and a phototransistor, the LED is connected in parallel to the bias resistor, an anode of the LED is connected to a first terminal of the second resistor, a second terminal of the second resistor is connected to a power supply, and a cathode of the LED is connected to the bias resistor to form an output terminal of the optocoupler circuit module; and a collector of the phototransistor is connected to a first terminal of the first resistor, a second terminal of the first resistor is connected to a power supply of a control unit, the collector of the phototransistor is further used to connect an input-output (IO) port of the control unit, and an emitter of the phototransistor is connected to an isolated ground;

the low-level active path module comprises a diode, an anode of the diode is an input terminal of the low-level active path module, and a cathode of the diode is an output terminal of the low-level active path module;

the high-level active path module comprises a negative-positive-negative (NPN) transistor, a base voltage divider of the NPN transistor, an emitter voltage divider of the NPN transistor, and a positive-negative-positive (PNP) transistor;

the base voltage divider of the NPN transistor is composed of a fifth resistor and a sixth resistor, a first terminal of the fifth resistor is connected to the output terminal of the low-level active path module, a second terminal of the fifth resistor is connected to a first terminal of the sixth resistor and a base of the NPN transistor, and a second terminal of the sixth resistor is connected to a common ground;

the emitter voltage divider of the NPN transistor comprises a seventh resistor, an eighth resistor, and a second capacitor, an emitter of the NPN transistor is connected to a first terminal of the seventh resistor, a second terminal of the seventh resistor is connected to the power supply, the emitter of the NPN transistor is further connected to a first terminal of the eighth resistor, the other terminal of the eighth resistor is connected to the common ground, and the second capacitor is connected in parallel to the eighth resistor; and a collector of the NPN transistor is connected to a base of the PNP transistor, an emitter of the PNP transistor is connected to the output terminal of the optocoupler circuit module, and a collector of the PNP transistor is connected to the common ground;

the filtering and debouncing module comprises a third resistor, a fourth resistor, and a first capacitor, a first terminal of the third resistor is connected to the output terminal of the low-level active path module, a second terminal of the third resistor is connected to a first terminal of the fourth resistor, the second terminal of the third resistor is further connected to a first terminal of the first capacitor, a second terminal of the first capacitor is connected to the common ground, a second terminal of the fourth resistor is connected to the wiring terminal, and the wiring terminal is used to connect an external switch;

the transient suppression module is a transient suppression diode, an input terminal of the transient suppression diode is connected to the second terminal of the fourth resistor, and an output terminal of the transient suppression diode is connected to the common ground;

when the external switch connected to the wiring terminal is in a suspended state or the wiring terminal is not connected to the external switch, a current from the power supply passes through the second resistor, then mainly through the bias resistor, then through the low-level active path module, and then through the base voltage divider of the NPN transistor of the high-level active path module, and then returns to the common ground, and the current passing through the LED is incapable of making the optocoupler conducted; and under pull-up action of the first resistor, a level to the IO port of the control unit is high;

when the wiring terminal is connected to the low-level active switch, and the low-level active switch is in the closed state, a voltage difference between the base and the emitter of the NPN transistor is incapable of making the base and the emitter conducted, and a current from the power supply passes through the second resistor, then mainly through the LED, then through the low-level active path module, then through the filtering and debouncing module, then through the wiring terminal, and then through the external low-level active switch, and returns to the common ground, and the high-level active path module is invalid; and the current passing through the LED makes the optocoupler conducted, and under pull-down action of the phototransistor, a level to the IO port of the control unit is low; and when the wiring terminal is connected to the high-level active switch, and the high-level active switch is in the closed state, a cathode voltage of the diode in the low-level active path module is greater than an anode voltage, and the low-level active path module is invalid; a first current starts from the power supply, passes through the emitter voltage divider of the NPN transistor in the high-level active path module, and then flows back to the common ground to obtain an emitter voltage of the NPN transistor; a second current starts from the power supply, passes through the high-level active switch, through the wiring terminal, through the filtering and debouncing module, and through the base voltage divider of the NPN transistor in the high-level active path module, and flows back to the common ground, and a voltage difference between the base and the emitter of the NPN transistor makes the base and the emitter conducted; a third current starts from the base voltage divider of the NPN transistor, passes through the base of the NPN transistor, through the emitter of the NPN transistor, and through the eighth resistor, and flows back to the common ground, and at this time, the NPN transistor is in an amplification region; a fourth current starts from the power supply, passes through the second resistor, then mainly through the LED, then through the emitter of the PNP transistor, then through the base of the PNP transistor, then through the collector of the NPN transistor, then through the emitter of the NPN transistor, and then through the eighth resistor, and flows back to the common ground, and at this time, the PNP transistor is in the amplification region; a fifth current starts from the power supply, mainly passes through the LED, then through the emitter of the PNP transistor, and then through the collector of the PNP transistor, and returns to the common ground; and the current passing through the LED makes the optocoupler conducted, and under pull-down action of the phototransistor of the optocoupler, a level to the IO port of the control unit is low.

2. The detection circuit for open, close and suspension states of a high and low level effective switch in a vehicle according to claim 1, wherein:

a power supply voltage is +26±4 V, and the first resistor is 4,700 ohms or 10,000 ohms; the second resistor is 4,000 ohms, the bias resistor is 1,000 ohms, a clamping voltage of the LED is 1 V, a cutoff frequency of the filtering and debouncing module is less than 1 kHz, and resistance values of the third resistor and the fourth resistor are less than 100 ohms; and a difference between a voltage division value of the base voltage divider of the NPN transistor and a voltage division value of the emitter voltage divider of the NPN transistor in the high-level active path module is in a range of 0-0.5 V when the external switch is in the suspended state, and greater than 0.7 V when the switch is in the closed state; when the external high-level active switch is in the closed state, the NPN transistor in the high-level active path module is in the amplification region; and leakage currents of the base voltage divider of the NPN transistor and the emitter voltage divider of the NPN transistor are 1 mA respectively when the external switch is in the suspended state or when the external switch is not connected.

* * * * *